United States Patent [19]

Bonhomme

[11] 4,119,357

[45] Oct. 10, 1978

[54] CONNECTOR FOR PRINTED CIRCUIT BOARDS

[76] Inventor: François Robert Bonhomme, 6, Parc de Béarn, 92210 Saint Cloud, France

[21] Appl. No.: 701,648

[22] Filed: Jul. 1, 1976

[51] Int. Cl.[2] ........................ H01R 13/62; H05K 1/07

[52] U.S. Cl. ............................ 339/75 MP; 339/17 L; 339/176 MP

[58] Field of Search ........ 339/75 MP, 176 MP, 17 L, 339/17 LC; 200/8 R

[56] References Cited

U.S. PATENT DOCUMENTS

| | | | |
|---|---|---|---|
| 3,478,301 | 11/1969 | Conrad et al. | 339/75 MP |
| 3,596,230 | 7/1971 | Ecker | 339/176 MP X |
| 3,636,499 | 1/1972 | Winklebleck | 339/75 MP |

*Primary Examiner*—Roy Lake
*Assistant Examiner*—E. F. Desmond
*Attorney, Agent, or Firm*—John A. Young

[57] ABSTRACT

A connector for printed circuit boards, having a plurality of resiliently deformable contact members movable between open and closed positions by a control member rotatably mounted in the connector case. The contact members each have a fixed end retained in the bottom of the case and a movable end attached to the control member. An active region situated between the movable and fixed ends serves in the closed position resiliently to contact a conducting connection track on a printed circuit board inserted in the connector. The portion of each contact member between its movable end and active region is less flexible than the portion between its active region and fixed end, the resulting deformation of the members on movement from their open to their closed positions facilitating self-cleaning of the conducting tracks of the board and the active region of the contact members.

14 Claims, 17 Drawing Figures

CONNECTOR FOR PRINTED CIRCUIT BOARDS

This invention relates to connectors for printed circuit boards.

More particularly, the invention relates to connectors for printed circuit boards, comprising: a case having a groove into which a printed circuit board can be introduced by one of its edges; a plurality of resiliently deformable contact members which are orientated transversely with respect of the length of the groove and are each equipped with a movable end and a fixed end which is held in a substantially invariable position and shape by the bottom of the case; and a control member mounted for rotation on the case to cause alternately the opening and closing of the contact members which are situated at the same side of the mean plane of the groove in the case, which members, on closing, each come to touch, with an active region situated between the movable and fixed ends, with a suitable resilient force, conducting connection tracks carried by the board to be connected and ending transversely at the side of the board adjacent to the groove, when the board has been introduced into the connector and the contact members thereof have been closed.

For a long time, an effort has been made to solve the problem caused by the need for "opening" of the contact members just before and during the introduction of any board into a connection device (which generally comprises a plurality of connectors) and just before and during the extraction of said board from the device, in other words the problem of removing the active regions of the contact members from the volume then swept by this board so as to render the force necessary for the introduction or the extraction of the board substantially zero and so to protect the protective coverings of both the contact members of the connector or connectors and the conducting connection tracks of the boards, from any wear by friction. Of course, it is essential, once the board has reached its working position, for the contact members to "close", that is to say to come to bear resiliently with their active regions on the corresponding connection tracks of the board, which tracks are generally provided on both sides of the board.

In his U.S. patent application No. 665,864 of March 11, 1976 the Applicant has already described a mechanism which uses, not the rotation but the translation of a control member and which acts on the resilient contact members of the connector or connectors, alternately in the opening sense and in the closing sense. As a result of this alternating control mechanism, the operator is thus assured both of the opening of all the contact members, just before and during the introduction or the extraction of the board, and of their closing with a suitable resilient force, once the board has reached its working position. In the French certificate of addition No. 72,723/1,174,063, the Applicant has also described a mechanism which uses the rotation of a control member but which is adapted in such a manner as to eliminate any sliding friction; the rotational movement of this control member is caused directly by the introduction and extraction movement of the board.

The object of the invention is to create a novel connector which not only fulfils the same functions as that described in the above-mentioned patent application, but also makes the self-cleaning more effective, that is to say an automatic mutual wiping of the conducting connection tracks and of the active regions of the contact members, on the closing of the latter. "Wiping" is here understood to mean a relative sliding which is sufficient to eliminate the dust liable to hamper the transmission of low voltage signals between said active regions and conducting tracks, but insufficient to cause the wear by friction of the above-mentioned protective coverings. It is likewise an object of the invention to reduce the distance, and consequently the duration of transfer of the electric signals, between the active region of each contact member and its fixed end. Preferably, moreover, it is an object of the invention to adapt the connectors so that their contact members can be removed and re-inserted or replaced individually.

According to the invention there is provided a connecter for printed circuit boards, comprising: a case having a groove into which a printed circuit board can be introduced by one of its edges; a plurality of resiliently deformable contact members, each disposed transversely of the length of the groove and each having a movable end, and a fixed end retained in the bottom of the case; and a control member rotatably mounted on the case to effect movement of the contact members between open and closed positions, and situated to the same side of the median plane of the groove in the case as the corresponding contact members, which members each have an active region situated between the movable and fixed ends and serving in the closed position resiliently to contact a conducting connection track on a board inserted in the groove and at the side of the board adjacent to the contact members, characterised in that each contact member is attached by its movable end to the control member with respect to which it describes approximately one half-turn and that each contact member comprises between its movable and fixed ends a first portion and a second portion, the first portion being located between the movable end and the active region and being less flexible than the second portion which is located between the active region and the fixed end, whereby self-cleaning of the conducting tracks of the board and of the active regions of the contact members is facilitated on movement of the members from open to closed positions.

In this manner, when, starting from the open position, the control member is caused to turn in the direction which tends to reduce the angle of winding of each contact member round this control member, the radial distance (in relation to this latter member) of the active region is at first caused to increase until this region comes to touch the conducting connection track which is associated therewith. Then, because of the differences in flexibility, the first portion continues to be displaced in the same direction, causing the active region to slide along the conducting connection track, which arises because the deformation to which the contact member is subject occurs mainly in its second portion.

Several solutions may be adopted within the scope of the invention in order that the two portions of each contact member may have different flexibilities; in particular, the cross sectional area of the first portion may be greater than that of the second portion, or the first portion may have a continuous longitudinal development and the second portion a longitudinal development which is made discontinuous by a loop, a backward bend or any other incipient local deformation, or the first portion may have a cross section such that the portion has a greater mechanical stiffness than that of the second portion. Needless to say, these three solutions may be combined with one another in any manner.

According to an advantageous construction, the control member consists of a solid rod of insulating material which is provided with a radial slot at the location of each of the contact members relative to the axis of the rod, the movable end of each contact member being inserted in the corresponding slot.

In this latter case, in order to permit the removal of the contact members, the movable end of each contact member is engaged freely in the radial slot in the rotary member; the fixed end is engaged freely in a slot extending through the bottom of the case, in which slot it is held by removable means; and the fixed end and, in the open position, the movable end are disposed in planes perpendicular to the plane in which the bottom of the case is disposed. In this manner, after the control member has been placed in the opening position and the fixed end of the contact member to be removed has been released, the member can be extracted by pulling it perpendicularly to the bottom of the case, in the direction which moves it away from this bottom. The reinsertion of the contact member in question or insertion of a new contact member is effected by repeating the same operations in the reverse sense.

The invention will now be explained in more detail with reference to the accompanying drawings which illustrate several embodiments thereof.

FIG. 1, of these drawings, shows, in diagrammatic perspective, a connector for printed circuit boards, according to a first embodiment of the invention, the upper portion of the Figure illustrating the position for opening a contact member and the lower portion the position for closing another contact member.

Figure 17:
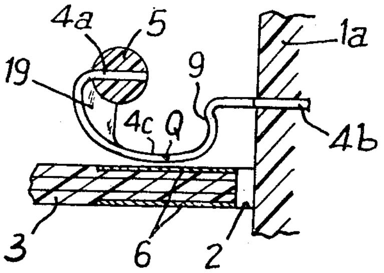

Finally, FIG. 17 shows a modification of the embodiment of FIGS. 1 to 5.

Figure 1:
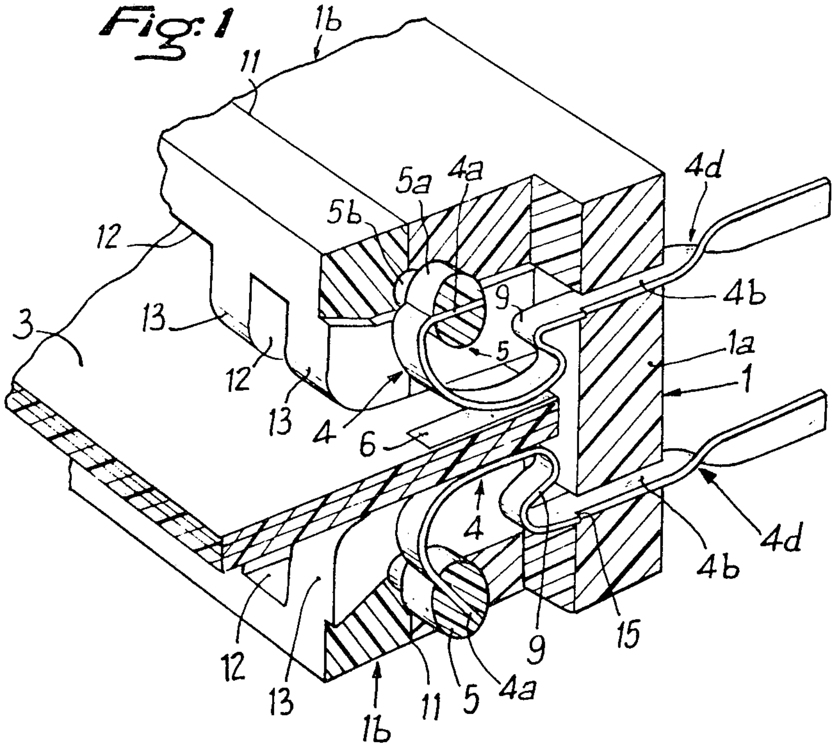

The connector illustrated diagrammatically in FIG. 1 comprises a case 1 which is made of insulating material and which comprises a bottom 1*a* and two flanges 1*b*. Thus this case has a U-section which leaves free a central groove 2 (see FIGS. 2 to 5). A printed circuit board 3 can be introduced inside this groove 2, by one of its edges. The connector further comprises, at each side of the median plane P of the groove 2, a plurality of resiliently deformable contact members 4 which are disposed transversely of the length of the groove 2 and are each equipped with a movable end 4*a* and a fixed end 4*b*. The fixed end 4*b* is held in a substantially invariable position and shape by the bottom 1*a* of the case 1. The connector further comprises two control members 5, disposed in a substantially symmetrical manner with respect to the median plane P of the groove 2 (that is to say with respect to the median plane of the board 3 placed in the connector). These members 5 are adapted to cause alternately the opening (see top of FIG. 1 and FIG. 2) and the closing (see bottom of FIG. 1 and FIG. 4) of the contact members 4 which are situated at the same side of the plane P. In this manner, the contact members 4 each come to touch, with an active region 4*c* (see FIGS. 2 to 4) situated between the ends 4*a* and 4*b*, conducting connection tracks 6 carried by the board 3 and ending at the side of the board adjacent to the groove 2 when the board 3 has been introduced into the connector and the contact members 4 have been closed.

Figure 2:
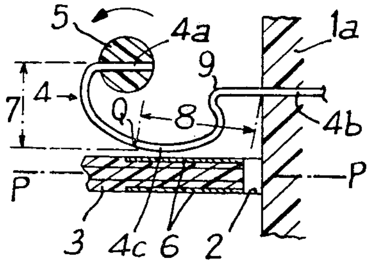
FIGS. 2, 3 and 4 illustrate, with coss sections, the position for opening, an intermediate position and the position for closing the contact member of the connector of FIG. 1.

Each contact member 4 is attached by its movable end 4*a* to the rotary control member 5 round which it describes approximately one half-turn (or half-turn of a helix) and it is adapted to have, in its deformable portion comprised between its ends 4*a* and 4*b*, less flexibility in its first portion 7 comprised between the movable end 4*a* and the active region 4*c* than in its second portion 8 comprised between the active region 4*c* and the fixed end 4*b* (see FIG. 2).

According to the embodiment in FIGS. 1 to 5, each contact member 4 is formed by a metal strip curved in such a manner that the generatrices of its curved surface are parallel to the axis of the control member 5. The portion 7 has a continuous longitudinal development, in the form of a spiral, while the portion 8 has a longitudinal development which is rendered discontinuous by an S-shaped deformation 9 which is arranged between the fixed end 4*b* and the active region 4*c*.

The control member 5 consists of a solid rod of insulating material which is provided with a radial slot or groove 10 (see FIG. 5) at the position of each of the contact members 4, the movable end 4*a* of which is inserted in this slot. The slots 10 are preferably formed on cylindrical portions 5*a* having a larger diameter than the cylindrical portions 5*b* forming trunnions inside the flanges 1*b* of the case. In order that the rod may be introduced into these flanges 1*b*, despite the presence of the cylindrical portions 5*a*, the flanges may be divided by separation surfaces 11 passing through the axis of the control members 5. The latter are equipped with operating levers (not shown) which emerge at the end of the case 1.

At the position of each member 4, the flanges 1*b* have a slot 12 which is orientated parallel to this flange and is open towards the plane P. The width of the slots 12 is only slightly greater than the thickness of the contact members 4. Each slot 12 is bounded by the lateral faces of two teeth 13 of rectangular section. Between the teeth 13 of the opposite flanges 1*b* there is a gap sufficient to receive the edge of the board 3.

The movable end 4*a* of each contact member 4 is engaged freely in the radial groove 10 in the control member 5 which is allocated thereto. Similarly, the fixed end 4*b* is engaged freely in a slot or groove 14 (FIG. 5) traversing the bottom 1*a* of the case 1 against which it is held by removable means. According to the form of embodiment in FIGS. 1 to 5, the groove 14 has a width less than the normal width of the contact member 4, the fixed end 4*b* of which is narrowed, forming a shoulder 15, so as to be able to penetrate into the groove 14. This limits the driving in of this end 4*b* which can be held in position by twisting, as shown at 4*d*, the tail of the contact member, that is to say the portion of its fixed end 4*b* which passes through the bottom 1*a* of the case 1. As FIGS. 1 (top), 2 and 5 show, the fixed end 4*b* and, in the open position, the movable end 4a are orientated perpendicular to the bottom 1a. Finally, the case 1 is open, at the side opposite to the bottom 1a (that is to say towards the left of FIGS. 1 to 5), at the level of each contact member 4.

Thus a connector is obtained, the assembly and mode of operation of which are as follows: first the rotary members 5 are placed in position, after which each flange 1b is assembled along its separation plane 11. Then, with the control members 5 in their opening position, each contact member 4 is introduced, bringing it towards the bottom 1a parallel to the plane P, in the opposite direction to that of the arrow in FIG. 5. This causes the movable end 4a to enter the groove 10 in the corresponding control member 5 and the fixed end 4b to enter the groove 14 in the bottom 1a. When this end 4b is stopped by contact of the shoulder 15 with the inside edge of the bottom 1a, its projecting portion is twisted as shown at 4d in FIG. 1. The contact member 4 is then in the position illustrated in FIG. 2. Once all the members 4 have been placed in position connections can be made to their projecting portions or tails, so that the connector is ready for operation. The active region 4c is withdrawn with respect to the location of the board 3. A board can therefore be introduced without the contact members 4 scraping or rubbing the conducting tracks 6 of the board 3, as can be seen from FIG. 2.

Figure 3:
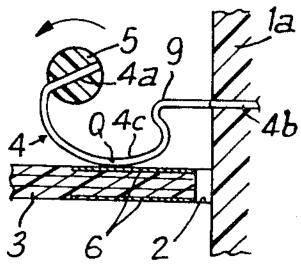
Figure 4:
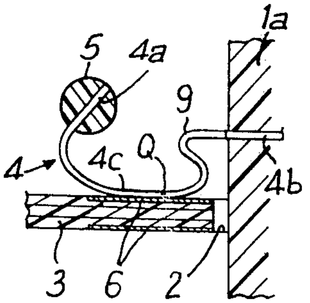

The upper control member 5 is now turned in the direction of the arrow in FIGS. 2 to 4, that is to say in the direction which tends to reduce the angle of winding of each contact member 4 round the control member 5. Thus the radial distance of the active region 4c is at first caused to increase until this comes to touch the conducting track 6 which is associated therewith, first of all at a point Q (or more precisely along a generatrix perpendicular to the plane of FIGS. 2 to 4 and passing through this point Q). This is the position illustrated in FIG. 3 where contact is established, without force, between the contact members 4 and the tracks 6. The control member 5 continues to be turned in the same direction. Because of the differences in flexibility between the portions 7 and 8, the first portion 7 continues to be displaced, causing the active region 4c to slide along the conducting track 6 while the S-shaped portion 9 is subjected to a more pronounced deformation. The result is, simultaneously, a sliding of the point Q on the track 6 (as can be seen by comparison between FIGS. 3 and 4), that is to say a selfcleaning of the contact surfaces, and a flattening of the active region 4c against the track 6, which improves the conditions for the passage of electric current. Another feature which improves these conditions of passage lies in the short length between the active region 4c and the tail of the contact member 4. Thus it is certain that all the members 4 contact the tracks 6 with a suitable resilient force after elimination of the dust liable to hamper the passage of current and contact over an appreciable area because of the flattening of the active region.

In order to open the connector, that is to say in order to withdraw the contact members 4 with respect to the tracks 6 of the printed circuit board 3, it is sufficient to cause the control member 5 to turn in the opposite direction, which causes each contact member to pass successively through the positions of FIGS. 3 and 2.

Figure 5:
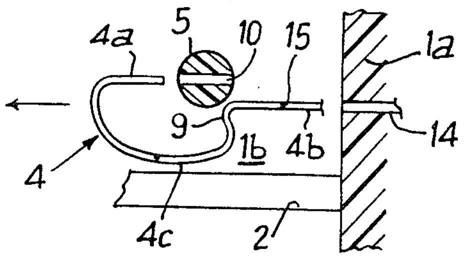
FIG. 5 illustrates the operation of dismounting the contact member of FIGS. 2 to 4.
Figure 6:
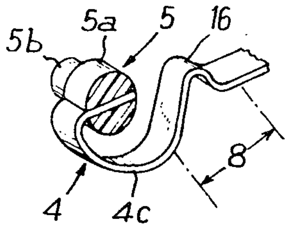
FIG. 6 shows, in perspective, a contact member according to a second embodiment of the invention, and its rotary control member.

If it is desired to check or replace a member 4, it is sufficient to disconnect its tail, to untwist the twisted portion 4d (see FIG. 1) and to pull the contact member in the direction of the arrow in FIG. 5.

Figure 7:
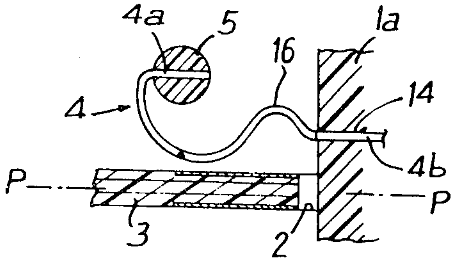
FIGS. 7 to 9 illustrate, in a similar manner to FIGS. 2 to 4, three positions of the contact member of FIG. 6.
Figure 8:
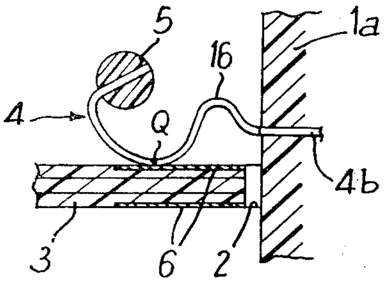
Figure 9:
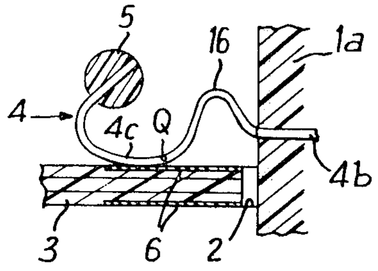
Figure 10:
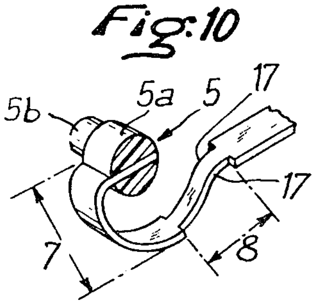
FIG. 10 shows, in perspective, a contact member according to a third embodiment of the invention, and its rotary control member.
Figure 11:
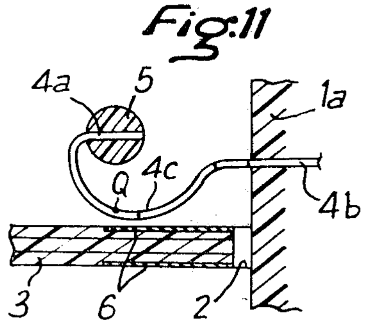
FIGS. 11 to 13 illustrate, in a similar manner to FIGS. 2 to 4, three positions of the contact member of FIG. 10.
Figure 12:
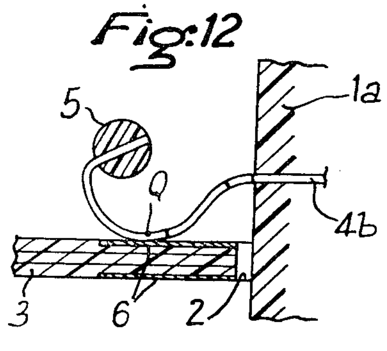
Figure 13:
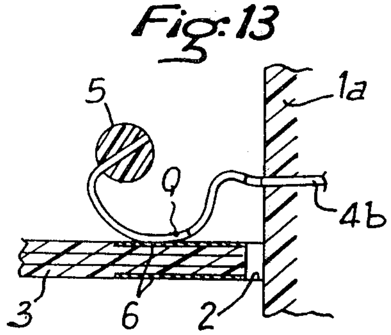

The form of embodiment in FIGS. 1 to 5 is distinguished by the S-shaped permanent deformation 9 which ends tangentially at the fixed end 4b and at the active region 4c and which enhances a deformation parallel to the plane P of the groove 2 in the portion 8 having the greater flexibility. The embodiment of FIGS. 6 to 9 only differs from the preceding one in the replacement of the S-shaped permanent deformation 9 by a permanent deformation 16 in the form of a boss which is more or less symmetrical with respect to a perpendicular to the plane P. In this case, when the connector is closed (successive passage through the positions of FIGS. 7, 8 and 9), the sides of the boss are pressed towards one another, increasing the height of this boss, with the same effect of sliding of the point Q and flattening of the active region 4c. Another difference in comparison with the previous embodiment consists in that the slot 14 in which the fixed end 4b of the contact member 4 is engaged is closer to the plane P to facilitate the passage of the deformation 16 under the control member 5 during removal (cf FIG. 5) or replacement of the contact member 4.

Figure 15:
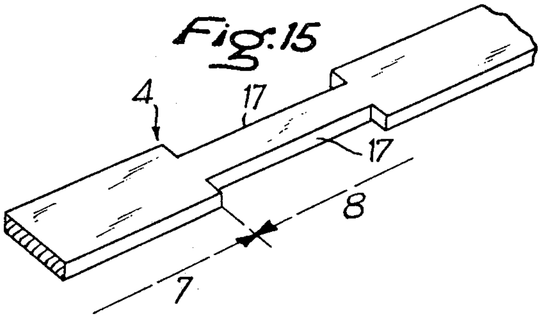

According to the embodiment in FIGS. 10 to 13, the contact member of which is illustrated on a larger scale in FIG. 15, the difference in flexibility between the portions 7 and 8 is due to the fact that the cross section of the first portion 7 has a larger surface than that of the second portion 8. If a metal strip with a section of 0.80 × 0.40 mm is used, for example, it is possible to provide cut-outs at both sides to transform it, in the region of portion 8, into a wire of square section 0.40 × 0.40 mm or of rectangular section 0.30 × 0.40 mm. The cut-outs which are thus formed by cutting away so as to reduce the section of the contact member 4 locally are designated by 17 in FIGS. 10 and 15. This form of embodiment has the advantage, in comparison with the previous ones, of shortening the portion of the member 4 which is comprised between the active region 4c and the tail by means of which the external connection is made. Its operation is the same as that of the previous embodiments and the deformation of the contact member 4 can be seen from a comparison between FIGS. 11 (open), 12 (coming into contact through the point Q) and 13 (closed).

Figure 14:
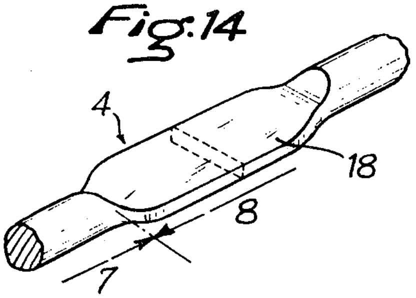
FIGS. 14 to 16 show, in perspective, on a larger scale, three possible forms of a contact member for use in the embodiment of FIGS. 10 to 13.

Part of a further form of contact member is illustrated in FIG. 14. According to this solution, the portion 7 with less flexibility has a cross section having a greater mechanical strength than that of the portion 8. In this case, the starting material may, for example, be a resilient wire having a circular section with a diameter of 0.50 mm. For the portion 8, the wire is flattened over a certain length, as illustrated at 18, in order to obtain a flat wire having a section 0.25 × 0.75 for example, the flat wire being disposed in a plane parallel to the plane P, in the connector. The deformation of the contact member 4 thus constituted is similar to that of the embodiment of FIGS. 10 to 13.

Figure 16:
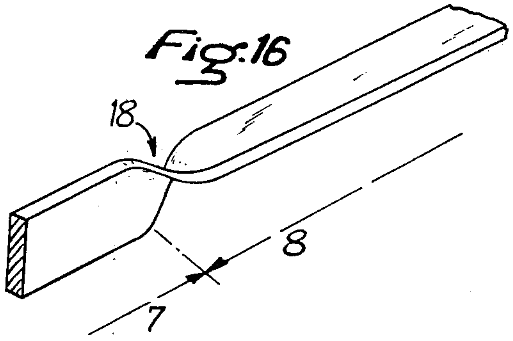

In the contact member partly illustrated in FIG. 16, the difference in flexibility between the portions 7 and 8 is obtained as a result of the fact that the portion 7 has a cross section having a greater mechanical strength than that of the portion 8, bearing in mind the forces to which the rotation of the control member 5 subjects the contact member 4. If a flat wire is used as the starting material, it is possible to obtain the portion 7 by locating the contact member in the case, with the plane in which portion 7 is disposed perpendicular to the axis of the member 5, and, by twisting the wire through 90° as indicated at 18 in FIG. 16, arrange the plane in which portion 8 is disposed parallel to the axis of the member 5.

In order that all the possibilities offered within the scope of the invention may be better understood, a modification of the embodiment in FIGS. 1 to 5 is illustrated in FIG. 17 which is distinguished by the presence of a stiffening element 19 which is, for example, soldered to the control member 5 and to the portion of the contact member 4 closest to said member 5 to make this portion substantially non-deformable. Another solution, to make the portion 7 less flexible than portion 8, which might be employed when portion 7 is for example circular in cross-section, consists in threading on the portion 7 either a helical metal wire or a resiliently deformable sheath.

I claim:

1. A connector including a contact member, said contact member consisting of two differentially resilient portions, and an intermediate active portion, means for capturing the ends of said portions, means for actuating by rotation the less resilient one of said portions to effect in sequence, a linear engagement between the active portion of said contact member and a confronting conducting track, a resilient deformation of said resilient portions into a surface engagement between said portions and the confronting conducting track and an accompanying sliding action between the deformed resilient portion which then constitute the active portion and the confronting conducting track surface which is slidingly wiped as rotation of said less resilient portion is progressively effected.

2. A connector as claimed in claim 1 in which two such sets of contact members are provided one on each side of a printed circuit board to effect connections with opposite sides of a printed circuit board through conducting connection tracks carried by said board at opposite sides thereof.

3. A connector as claimed in claim 1 in which said differentially resilient portions form an arcuate configuration.

4. A connector as claimed in claim 1 in which the differentially resilient portions are provided by a reduced cross section of the less resilient one of said portions.

5. A connector as claimed in claim 1 in which the less resilient portion of said contact is obtainable by imparting an axial twist to effect stiffening of said less resilient.

6. A connector as claimed in claim 1 in which a reverse bend is produced in the more resilient portion of said contact member.

7. A connector for printed circuit boards, comprising: a case having a slot into which a printed circuit board can be introduced by one of its edges and with zero insertion resistance; a plurality of resiliently deformable contact members movable between open and closed positions independently of circuit board insertion and removal and spaced at intervals along said slot, each of said deformable contact members having a movable first captured end and a fixed second captured end which is retained in the bottom of said case; and control members rotatably mounted relative to said case to effect movement of said contact members between open and closed positions and situated to the same side of the median plane of said slot in said case as the corresponding contact members operated thereby, said contact members each having an active region situated between said movable and fixed captured ends and serving in said closed position first to contact linearly a conducting track on the board inserted in said slot, said active region then forming a sliding connection with said track and thereafter deformable to form a surface connection with said conducting track at the side of said board adjacent the respective contact members, each said contact member being attached by its movable captured end to said control member whereby the captured end of said contact member describes a partial rotational movement as the arcuate active region is deformed into flat surface contact with the conducting track on said board, each such contact member comprising a first portion and a second portion, said first portion being located between said movable captured end and said active region and being less flexible than said second portion, which is located between said active region and said fixed end whereby self cleaning occurs by sliding of the active region against the confronting surface of said conducting tracks of the board as the respective contact members are moved from said open to said closed positions.

8. A connector as claimed in claim 7 characterized in that a complementary set of resiliently deformable contact members are located one on each of opposite sides of said slot with a printed circuit board insertable to provide conducting tracks on each of opposite sides of said board and which are contacted by corresponding complementary contact members each having an active region first slideably engaged and thereafter contacted by surface contact with the respective active regions of said deformable contact members.

9. A connector claimed in claim 7, characterised in that said first portion has a continuous longitudinal development and said second portion has a longitudinal development rendered discontinuous

10. A connector as claimed in claim 7, characterised in that said first portion has a cross section such that the portion has a greater mechanical stiffness than the second portion.

11. A connector as claimed in claim 7, characterised in that the cross sectional area of said first portion is greater than that of said second portion.

12. A connector as claimed in claim 11, characterised in that said first portion has a continuous longitudinal development and said second portion has a longitudinal development rendered discontinuous by a loop, a backward bend or any other incipient local deformation.

13. A connector as claimed in claim 7, characterised in that said control member consists of a solid rod of insulating material which is equipped with a radial slot at the location of each of said contact members relative to the axis of said rod, the movable end of each contact member being inserted in the corresponding slot.

14. A connector as claimed in claim 13, characterised in that said movable end of each contact member is engaged freely in its radial slot in the control member, said fixed end is engaged freely in a slot extending through the bottom of said case, in which slot it is held by removable means; and said fixed end and, in the open position, said movable end are disposed in planes perpendicular to the plane in which the bottom of said case is disposed.

* * * * *

UNITED STATES PATENT OFFICE

CERTIFICATE OF CORRECTION

Patent No. 4,119,357 Dated October 10, 1978

Inventor(s) Francois R. Bonhomme

It is certified that error appears in the above-identified patent and that said Letters Patent are hereby corrected as shown below:

On the cover page, Item [30] should read;

France 75-21037 July 4, 1975.

Signed and Sealed this

*Sixteenth* Day of *January 1979*

[SEAL]

*Attest:*

RUTH C. MASON
*Attesting Officer*

DONALD W. BANNER
*Commissioner of Patents and Trademarks*